(12) United States Patent
Kakihara

(10) Patent No.: US 9,310,440 B2
(45) Date of Patent: Apr. 12, 2016

(54) DISCONNECTION DETECTING DEVICE FOR ROTATING ELECTRICAL MACHINE, METHOD FOR DETECTING DISCONNECTION OF ROTATING ELECTRICAL MACHINE

(71) Applicant: DENSO CORPORATION, Kariya, Aichi-pref. (JP)

(72) Inventor: Takayuki Kakihara, Kariya (JP)

(73) Assignee: DENSO CORPORATION, Kariya (JP)

( * ) Notice: Subject to any disclaimer, the term of this patent is extended or adjusted under 35 U.S.C. 154(b) by 43 days.

(21) Appl. No.: 14/061,400

(22) Filed: Oct. 23, 2013

(65) Prior Publication Data
US 2014/0118865 A1    May 1, 2014

(30) Foreign Application Priority Data

Oct. 26, 2012 (JP) ................................. 2012-236305

(51) Int. Cl.
*H02H 5/04* (2006.01)
*G01R 31/34* (2006.01)

(52) U.S. Cl.
CPC .................................... *G01R 31/343* (2013.01)

(58) Field of Classification Search
CPC ................................. H02H 5/04; H02H 7/093
USPC ......................................................... 361/23
See application file for complete search history.

(56) References Cited

U.S. PATENT DOCUMENTS

| | | | |
|---|---|---|---|
| 5,369,349 A | | 11/1994 | Tsuchiya et al. |
| 7,301,737 B2 * | | 11/2007 | Shima .............................. 361/31 |
| 8,766,589 B2 * | | 7/2014 | Takahashi et al. ............. 318/823 |
| 8,775,025 B2 * | | 7/2014 | Yamaguchi et al. ............ 701/41 |
| 9,000,700 B2 * | | 4/2015 | Kakihara .................. 318/400.22 |
| 9,041,324 B2 * | | 5/2015 | Suzuki et al. ............. 318/400.01 |
| 2003/0058589 A1 | | 3/2003 | Matsumoto et al. |
| 2012/0068721 A1 | | 3/2012 | Moon et al. |

(Continued)

FOREIGN PATENT DOCUMENTS

| | | |
|---|---|---|
| JP | 4-331493 | 11/1992 |
| JP | 2000-248982 | 9/2000 |

(Continued)

OTHER PUBLICATIONS

Office Action (2 pgs.) dated Nov. 17, 2015 issued in corresponding Japanese Application No. 2012-236305 with an at least partial English-language translation (2 pgs.).

*Primary Examiner* — Forrest M Phillips
(74) *Attorney, Agent, or Firm* — Nixon & Vanderhye P.C.

(57) ABSTRACT

A disconnection detecting device that can be applied to a control system of a motor-generator is provided. A disconnection detecting section judges whether logical conjunction (i.e. AND operation) of a condition that both current sensors are operating normally and a condition that the designated torque is equal to or more than a specified torque is true or not. In the event that the disconnection detecting section has determined YES, the disconnection detecting section judges whether the logical conjunction of a condition that the absolute value of the phase current is equal to or less than a specified current (>0) and a condition that the absolute value of the current change rate is equal to or less than a specified value (>0) is true or not. In the event that the disconnection detecting section has determined YES, the disconnection detecting section has determines that the disconnection has occurred.

12 Claims, 4 Drawing Sheets

(56) References Cited

U.S. PATENT DOCUMENTS

2013/0169205 A1* 7/2013 Kakihara .................. 318/400.22
2013/0300332 A1* 11/2013 Inamura et al. ............... 318/472
2014/0118865 A1* 5/2014 Kakihara ........................ 361/23

FOREIGN PATENT DOCUMENTS

| | | |
|---|---|---|
| JP | 3801471 | 5/2006 |
| JP | 2012-65529 | 3/2012 |

* cited by examiner

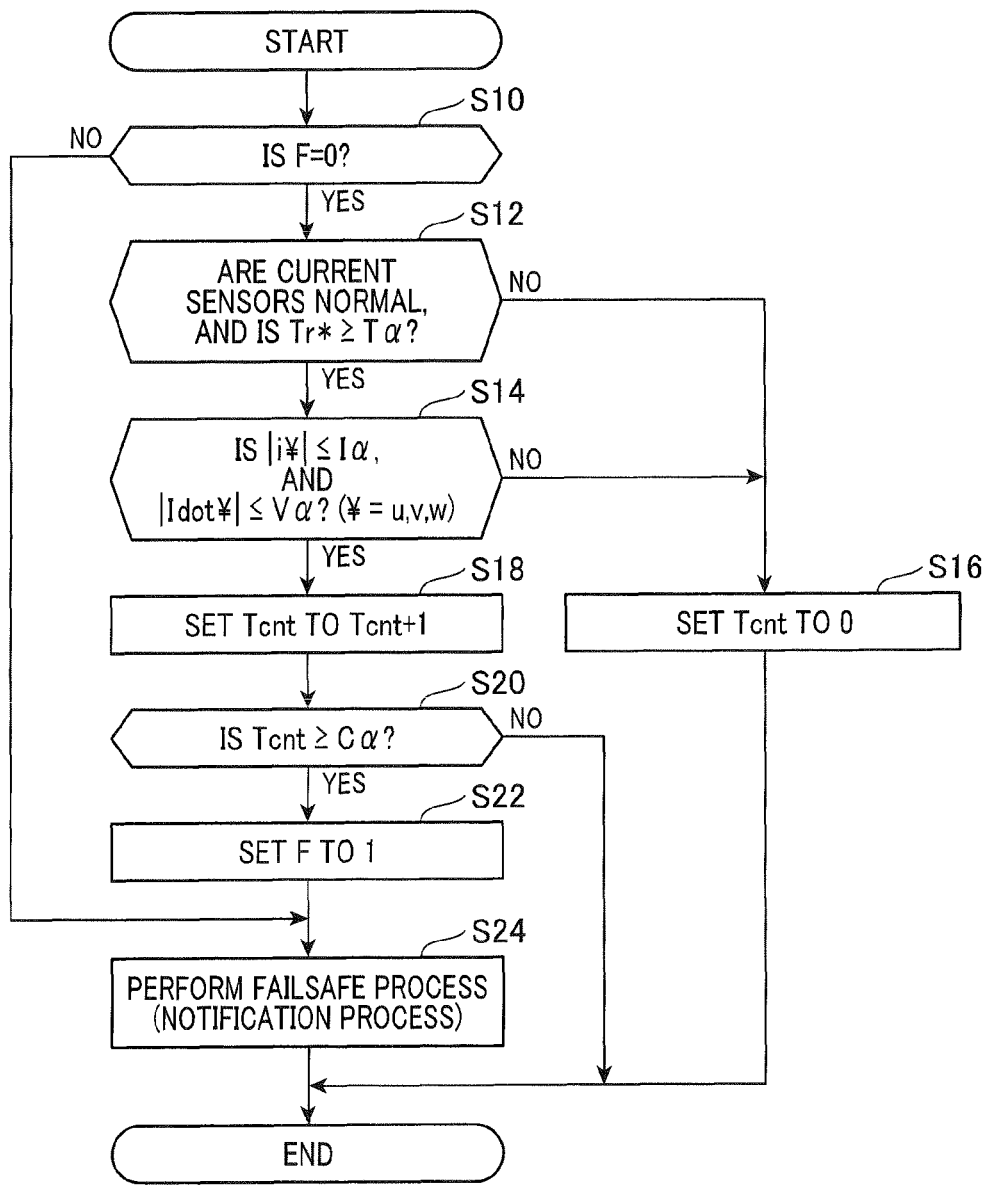

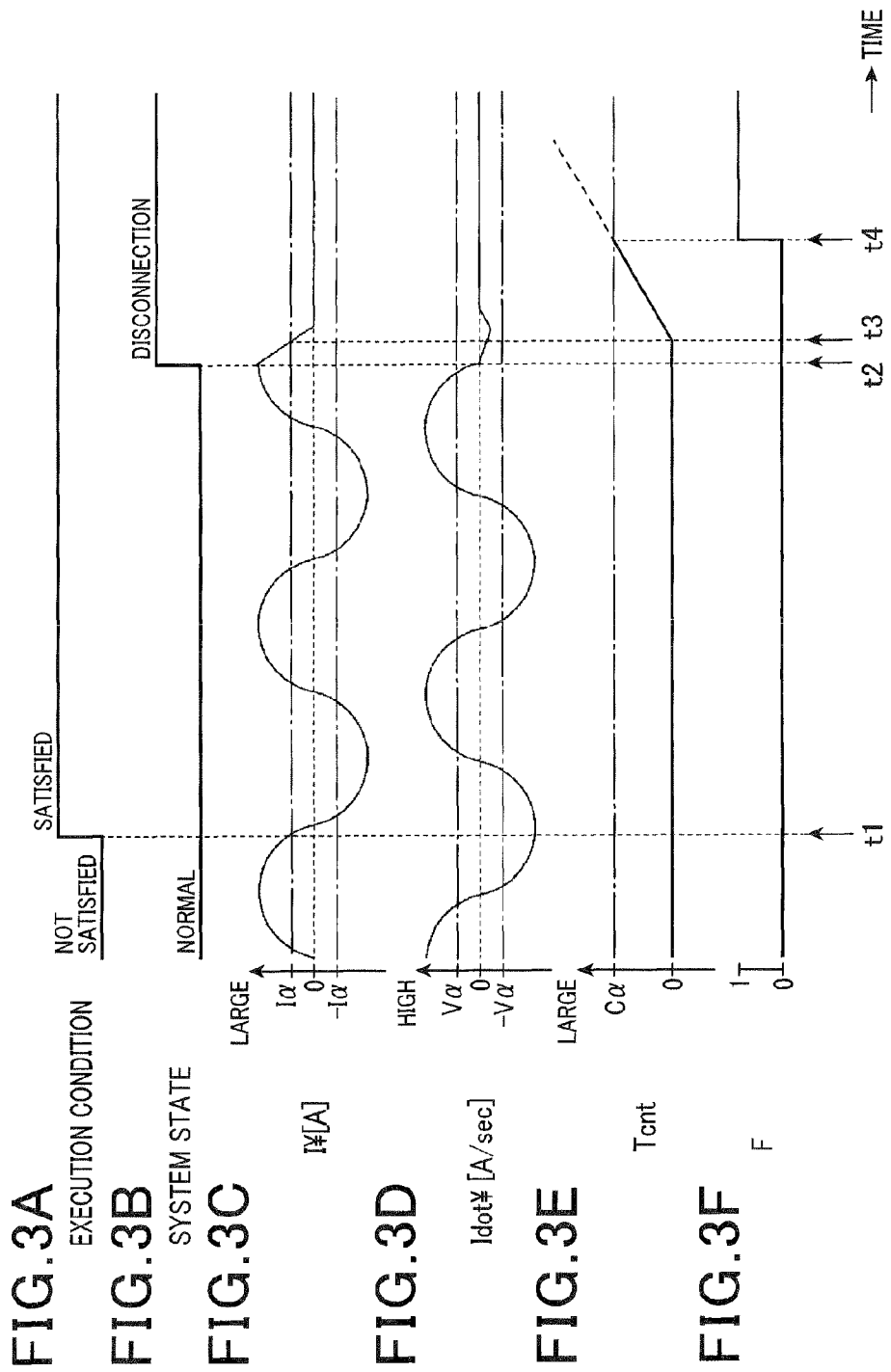

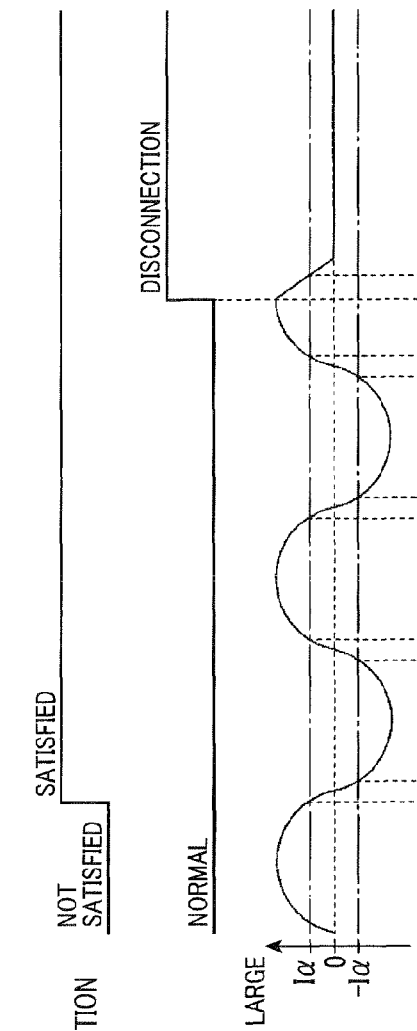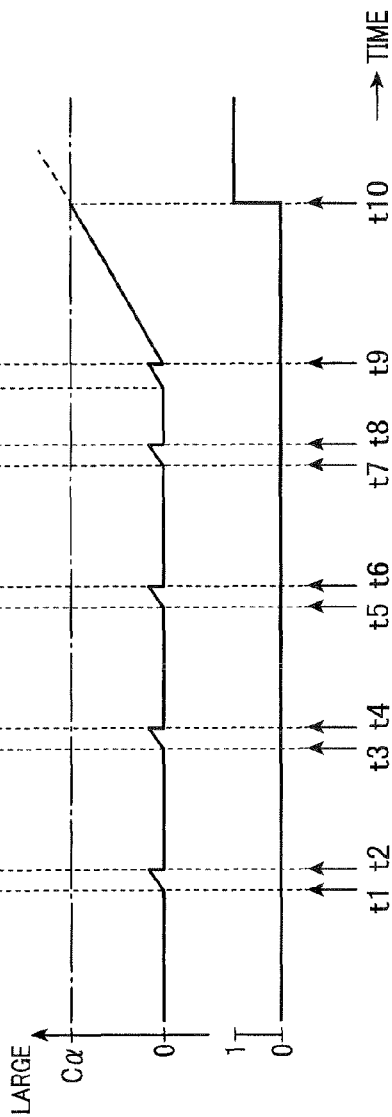

DISCONNECTION DETECTING DEVICE FOR ROTATING ELECTRICAL MACHINE, METHOD FOR DETECTING DISCONNECTION OF ROTATING ELECTRICAL MACHINE

CROSS-REFERENCE TO RELATED APPLICATION

This application is based on and claims the benefit of priority from earlier Japanese Patent Application No. 2012-236305 filed Oct. 26, 2012, the description of which is incorporated herein by reference.

BACKGROUND OF THE INVENTION

1. Field of the Invention

The present invention relates to a disconnection detecting device being capable for applying to a rotating electrical machine driven by alternating current, and method being capable for detecting disconnecting of the rotating electrical machine.

2. Description of the Related Art

As this type of device, as shown in Japanese registered patent JP-B-3801471, a device that detects disconnection of a power supply line of a brushless direct-current (DC) motor is known. Specifically, predetermined conditions including a condition that the current value of at least one phase of the alternating current supplied to the DC motor is approximately zero amperes are defined. When it is judged that the predetermined conditions are continuously satisfied for a specified amount of time, the device determines that disconnection of the power supply line has occurred.

The specified amount of time is set to prevent erroneous detection of disconnection. In other words, zero-crossing of the current flowing to the DC motor occurs even when disconnection of the power supply line has not occurred. Therefore, it is required that one differentiates a fact that the current zero-crosses during a normal operation in which disconnection has not occurred and another fact that the current becomes zero amperes when disconnection has actually occurred. The specified amount of time is set so as to meet this requirement.

As the rotation speed of the DC motor becomes higher, the amount of time that the current flowing to the DC motor during normal operation becomes near zero amperes becomes shorter. Therefore, the specified amount of time is set to be relatively long time corresponding in the low-speed range in order to prevent disconnection being erroneously detected despite a disconnection not having actually occurred within the low-speed range of the DC motor. When the specified amount of time is set in this way, within the high-speed range of the DC motor, the amount of time from when a disconnection actually occurs until the disconnection is detected increases. In other words, the rotation speed range of the DC motor in which disconnection can be promptly detected may be limited.

For the purpose of preventing such situations, for example, it can be considered that setting the specified amount of time so as to become shorter as the rotation speed of the DC motor increases. However, in this instance as well, the specified amount of time cannot be shortened within the low-speed range of the DC motor. The amount of time from when a disconnection actually occurs until the disconnection is detected may become long.

Hence, a disconnection detecting device being capable of applying a rotating electrical machine and promptly detecting a disconnection is desired.

SUMMARY

The present application provides a disconnection detecting device for a rotating electrical machine, comprising:
a CPU;
an execution judgment section being enable the CPU to judge whether or not predetermined execution conditions are satisfied including a condition that driving is commanded to the rotating electrical machine; and
a disconnection judgment section being enable the CPU to determine, during the execution conditions are satisfied, that a disconnection has occurred on a current flow path including the rotating electrical machine, based on a first condition that an absolute value of a line current flowing to the rotating electrical machine is equal to or less than a value of a specified current which is greater than zero, and a second condition that an absolute value of a rate of change in the line current is equal to or less than a specified value which is higher than zero. (First aspect of a disconnection detecting device for a rotating electrical machine of the present invention)

During a disconnection does not occur on the current flow path on the rotating electrical machine driven by alternating current, the rate of change in the line current flowing to the rotating electrical machine increases when a value of the line current flowing to the rotating electrical machine is small. On the other hand, the rate of change decreases when a value of the line current is large.

Conversely, in an event when a disconnection occurs, the rate of change in the line current becomes zero in addition to the line current flowing to the rotating electrical machine.

In view of this point, the inventors of the present invention have discovered that the amount of time from when a disconnection actually has occurred until the time a judgment can be made that the disconnection had occurred can be shortened by using the rate of change in the line current in addition to the line current flowing to the rotating electrical machine.

Therefore, in the present application, the disconnection judgment section is included. As a result, the amount of time from when a disconnection in the current flow path actually occurs until the disconnection is detected can be shortened. Furthermore, in the above-described configuration, limitation of a rotation speed range in which disconnection can be promptly detected can be prevented.

BRIEF DESCRIPTION OF THE DRAWINGS

In the accompanying drawings:

FIG. 2 shows a flowchart of processing operations in a disconnection detecting process according to the embodiment;

FIG. 3A to FIG. 3F shows a time chart of the disconnection detecting process according to the embodiment; and FIG. 4A to FIG. 4E shows a time chart of a disconnection detecting process in a comparative technique.

DETAILED DESCRIPTION OF THE PREFERRED EMBODIMENTS

Figure 1:
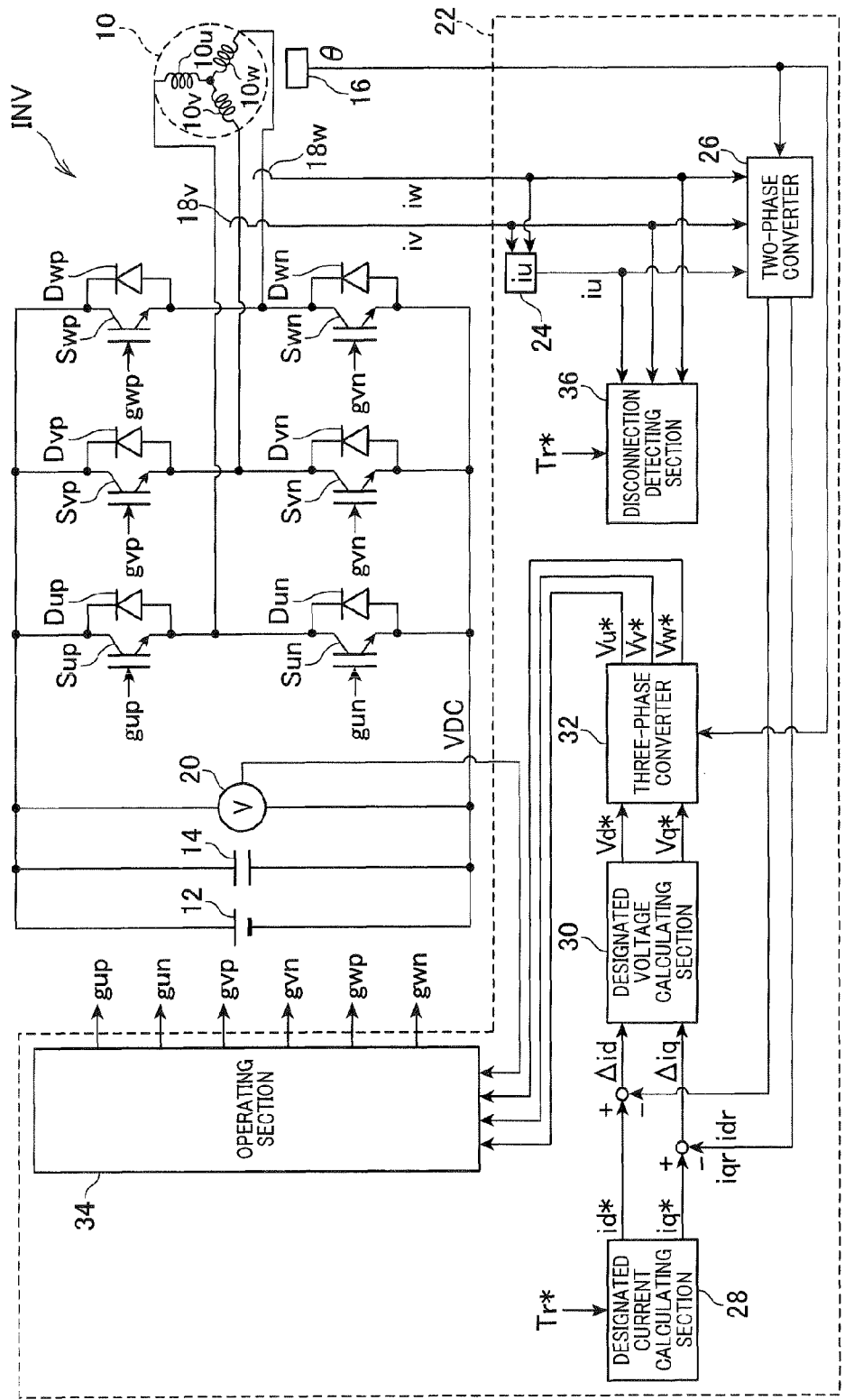
FIG. 1 shows a configuration diagram of a control system of a motor generator according to an embodiment.

An example in which a disconnection detecting device for a rotating electrical machine of the present invention is applied to a hybrid car that includes the rotating electrical machine as a main driving engine will hereinafter be described with reference to the drawings.

As shown in FIG. 1, a motor generator 10 serving as a main driving engine configuring a high-voltage system is a multiphase brushless DC motor. Specifically, the motor generator 10 is a three-phase permanent magnet synchronous motor (embedded magnet synchronous motor or surface-mounted magnet synchronous motor). A stator of the motor generator 10 includes a U-phase coil 10u, a V-phase coil 10v, and a W-phase coil 10w. The U-phase coil 10u, V-phase coil 10v, and W-phase coil 10w are connected by Y connection, as a result of one end of the respective coils being connected to one another at a neutral point.

The motor generator 10 is connected to a high-voltage battery 12 and a capacitor 14 with an inverter INV therebetween. The high-voltage battery 12 is a direct-current power supply of which the terminal voltage is, for example, 100V or more. The inverter INV includes three sets of serially connected members composed of switching elements S¥p and S¥n (¥=u,v,w). The respective connection points of the serially connected members are respectively connected to the U-phase, the V-phase, and the W-phase of the motor generator 10. According to the present embodiment, insulated gate bipolar transistors (IGBT) are used as the switching elements S¥# (#=n,p). A free wheel diode D¥# is connected in antiparallel with each switching element S¥#.

According to the present embodiment, the following is included as a detecting section for detecting the state of the motor generator 10 and the inverter INV. First, a rotation angle sensor 16 (such as a resolver) that detects the rotation angle (electrical angle θ) of the motor generator 10 is included. In addition, current sensors 18v and 18w are included as a current detecting section for detecting the V-phase current and W-phase current respectively flowing through the V-phase and the W-phase of the motor generator 10. For example, a current sensor including a current transformer or a resistor can be used as the current sensors 18v and 18w. Furthermore, a voltage sensor 20 that detects the input voltage (power supply voltage VDC) of the inverter INV is included.

The detection values of the various sensors described above are loaded into a control device 22 via an interface (not shown). The control device 22 configures a low-voltage system. The control device 22 includes a central processing unit (CPU) and a memory (RAM). The control device 22 is a software processing section for running programs stored in the memory by the CPU. The control device 22 generates and outputs operating signals g¥# for operating the switching element S¥# included in the inverter INV based on the detection values of the various sensors to control a controlled variable (output torque) of the motor generator 10 to a designated value (designated torque Tr*).

Specifically, the switching elements S¥# are operated such that a designated current for actualizing the designated torque Tr* and the current flowing to the motor generator 10 match. In other words, according to the present embodiment, although the output torque of the motor generator 10 is the ultimate controlled variable, the current flowing to the motor generator 10 serves as the direct controlled variable and is controlled to the designated current to control the output torque. In particular, according to the present embodiment, current vector control is performed to control the current flowing to the motor generator 10 to the designated current. A process related to the current vector control, among the processing operations performed by the control device 22, will be described hereafter.

A U-phase current calculating section 24 is a current calculating section for calculating a U-phase current from a V-phase current iv and a W-phase current iw detected by the current sensors 18v and 19w, based on Kirchhoff's Laws, The U-phase current calculated in this way is hereinafter referred to as a U-phase current calculation value iu.

A two-phase converter 26 converts the U-phase current calculation value iu, the V-phase current detection value iv, and the W-phase current detection value iw to a d-axis current idr and a q-axis current iqr that are currents of a rotational coordinates system, based on the electrical angle θ detected by the rotation angle sensor 16. In addition, a designated current calculating section 28 calculates a d-axis designated current id* and a q-axis designated current iq* that are designated values of currents on the rotational coordinates system, based on the designated torque Tr*. According to the present embodiment, the designated torque Tr* is inputted from a high-order control device that supervises vehicle control and is a separate control device from the control device 22.

A designated voltage calculating section 30 calculates designated voltages Vd* and Vq* on the d- and q-axes as manipulated variables for performing feedback control of the d-axis current idr and the q-axis current iqr to the d-axis designated current id* and the q-axis designated current iq*. Specifically, the designated voltage calculating section 30 calculates the designated voltage Vd* on the d-axis by performing proportional integral control based on the deviation Δid between the d-axis current idr and the d-axis designated current id*. The designated voltage calculating section 30 also calculates the designated voltage Vq* on the q-axis by performing proportional integral control based on the deviation Δiq between the q-axis current iqr and the q-axis designated current iq*.

A three-phase converter 32 converts the designated voltages Vd* and Vq* on the d- and q-axes to three-phase designated voltages V¥* (¥=u,v,w) in a fixed coordinate system of the motor generator 10. The designated voltages V¥* serve as manipulated variables for performing feedback control of the d- and q-axes currents idr and iqr to the designated currents id* and iq*.

An operating section 34 generates the operating signals g¥# used to set the output voltages of the three phases of the inverter INV to voltages simulating the designated voltages V¥*. According to the present embodiment, the operating signal g¥# is generated by a sine-wave pulse-width modulation (PWM) process based on large and small comparison between the designated voltage V¥* standardized by the input voltage VDC of the inverter INV detected by the voltage sensor 20 and a carrier (such as a triangular wave signal or a saw-tooth wave signal). The operating section 34 outputs the generated operating signal g¥# to the inverter INV via an interface (not shown). As a result, a sine-wave voltage is applied to the U-phase, V-phase, and W-phase of the motor generator 10 respectively, wherein a phase of each sine-wave voltage applied to the U-phase, V-phase, and W-phase of the motor generator 10 is shifted in turn 120 degrees from each other. That is, a sine-wave phase current having a phase shift of 120 degrees flows in the U-phase, V-phase, and W-phase of the motor generator 10. The motor generator 10 is driven by alternating current.

Next, the disconnection detecting process according to the present embodiment that is performed by a disconnection detecting section 36 of the control device 22 will be described. Disconnection refers to a disconnection on a current flow path from the positive terminal of the high-voltage battery 12 to the negative terminal of the high-voltage batter 12 via the inverter INV and the motor generator 10. As specific examples, the disconnection includes a disconnection within the motor generator 10 (such as an open failure in the coil 10u, 10v, or 10w), a disconnection of a wire connecting the motor generator 10 and the inverter INV, and a disconnection within the inverter INV (such as an open failure in the switching element S¥#).

FIG. 2 shows the processing operations in the disconnection detecting process. The process is repeatedly performed at, for example, a predetermined calculation cycle by the disconnection detecting section 36.

In the series of processing operations, first, at step S10, the disconnection detecting section 36 judges whether or not a value of a disconnection judgment flag F is 0 (zero). The disconnection judgment flag 0 (zero) indicates that a disconnection has not occurred and 1 indicates that a disconnection has occurred. The initial value of the disconnection judgment flag F is set to 0 (zero).

When determined YES at step S10, the disconnection detecting section 36 proceeds to step S12. The disconnection detecting section 36 judges whether or not a condition for executing disconnection detection is satisfied. According to the present embodiment, the execution condition is that the logical conjunction (AND operation) of a condition that both current sensors 18v and 18w are operating normally and a condition that the designated torque Tr* is equal to or more than a specified torque Tα is true. The condition relating to the current sensors 18v and 18w is provided to prevent situations in which a disconnection is erroneously judged to have occurred in spite of no actual disconnection having occurred, or where a disconnection is erroneously judged to have not occurred in spite of an actual disconnection having occurred at step S14.

In addition, the condition related to the designated torque Tr* is provided to prevent situations in which a disconnection is erroneously judged to have occurred in spite of no actual disconnection having occurred at step S14. In other words, when the designated torque Tr* is small, both the absolute value of the phase current i¥ (U-phase current calculation value iu, V-phase current detection value iv, and W-phase current detection value iw; ¥=u,v,w) and the absolute value of a rate of change in the phase current i¥ (hereinafter referred to as "current change rate Idot¥") become small, even when no disconnection has occurred. In this instance, the disconnection detecting section 36 may determine YES at step S14 in spite of a disconnection not having occurred. The condition relating to the designated torque Tr* is provided to prevent such situations.

The condition relating to the designated torque Tr* corresponds to a condition for judging whether or not the motor generator 10 is being driven. In addition, as means for judging whether or not the current sensors 18v and 18w are normally operating, a method for judging whether or not the output voltage (AD conversion value) of the current sensor remains at an upper limit value or a lower limit value can be adopted.

When determined YES at step S12, the disconnection detecting section 36 proceeds to step S14. The disconnection detecting section 36 judges whether or not the logical AND of a condition that the absolute value of the phase current i¥ is equal to or less than a specified current Iα (>0) and a condition that the absolute value of the current change rate Idot¥ is equal to or less than a specified value Vα (>0) is true. This processing operation is provided in order to judge whether or not a disconnection has occurred. The reason that the current change rate Idot¥ is used in disconnection detection is as follows.

Because the phases of the phase current i¥ and the current change rate Idot¥ are shifted by 90 degrees, when a disconnection has not occurred, the current change rate Idot¥ increases when the phase current i¥ is small. On the other hand, the current change rate Idot¥ decreases when the phase current i¥ is large. Conversely, when a disconnection has occurred, in addition to the phase current i¥, the current change rate Idot¥ becomes zero. Specifically, for example, when an open failure occurs in the V-phase coil 10v, the absolute value of the V-phase current and the absolute value of the change rate of the V-phase current become zero. Therefore, the current change rate Idot¥ serves as a parameter which allows the judgment that a disconnection has occurred to be fixed at an early stage after the disconnection has actually occurred. Therefore, the current change rate Idot¥ is used in disconnection detection.

The specified current Iα and the specified value Vα may be set to values that are, for example, slightly greater than zero. In addition, the current change rate Idot¥ may be calculated by, for example, a value that is the phase current i¥ of the current calculation cycle subtracted by the phase current i¥ of the preceding calculation cycle being divided by the calculation cycle. According to the present embodiment, because the motor generator 10 has a Y-connection structure as described above, the phase current and the line current are equal. Therefore, according to the present embodiment, the absolute value of the phase current i¥ being equal to or less than the specified current Iα corresponds to the absolute value of the line current being equal to or less than the specified current Iα. In addition, the absolute value of the current change rate Idot¥ being equal to or less than the specified value Vα corresponds to the absolute value of the rate of change in the line current being equal to or less than the specified value Vα.

When determined NO at step S12 or step S14, the disconnection detecting section 36 proceeds to step S16 and resets a counter Tcnt. On the other hand, when determined YES at step S14, the disconnection detecting section 36 proceeds to step S18 and increments the counter Tcnt by one.

At subsequent step S20, the disconnection detecting section 36 judges whether or not the counter value Tcnt has reached a specified value Cα (>0) or greater. This processing operation is provided in order to improve the accuracy of disconnection detection. In other words, for example, as a result that noise mixes with the phase current i¥ and then the disconnection detecting section 36 determine YES at above-described step S14, erroneous detection of a disconnection would happen nevertheless the disconnection has not actually occurred. The processing operation at step S20 is provided to prevent such situations.

When determined YES at step S20, the disconnection detecting section 36 determines that a disconnection has occurred and proceeds to step S22. At step S22, the disconnection detecting section 36 sets the value of the disconnection judgment flag F to 1.

When determined NO at step S10, or when the processing operation at step S22 is completed, the disconnection detecting section 36 proceeds to step S24 and performs a failsafe process. According to the present embodiment, a notification process for notifying the high-order control device that a disconnection has occurred is performed as the failsafe process. As a result, for example, an instruction to use only the internal combustion engine as the cruising power source is given in the high-order control device.

When determined NO at step S20 or when the processing operation at step S16 or step S24 is completed, the series of processing operations is temporarily ended.

Next, FIG. 3A to FIG. 3F shows an example of the disconnection detecting process according to the present embodiment. Specifically, FIG. 3A shows a transition based on whether or not the execution condition for disconnection detection is satisfied. FIG. 3B shows a transition based on whether or not a disconnection has occurred. FIG. 3C shows a transition in the phase current iΨ. FIG. 3D shows a transition in the current change rate IdotΨ. FIG. 3E shows a transition in the counter Tcnt. FIG. 3F shows a transition in the value of disconnection judgment flag F.

In the example shown in FIG. 3A to FIG. 3F, the execution condition for disconnection detection is satisfied at time t1. Subsequently, at time t2, a disconnection actually occurs. Therefore, the phase current iΨ starts to decrease towards zero. At subsequent time t3, the absolute value of the phase current iΨ is determined being equal to or less than the specified current Iα, and the absolute value of the current change rate IdotΨ is determined being equal to or less than the specified value Vα. Therefore, the upward count of the counter Tcnt starts.

Subsequently, at time t4 when the counter Tcnt reaches the specified value Cα, the value of the disconnection judgment flag F is set to 1.

Next, a disconnection detecting process in which the current change rate idotΨ is not used (hereinafter referred to as "a comparative technique") will be described with reference to FIG. 4A to FIG. 4E. Specifically, in the comparative technique, the condition relating to the current change rate IdotΨ is eliminated from step S14 in FIG. 2, described above. FIG. 4A to FIG. 4E respectively corresponds with FIG. 3A to FIG. 3C, and FIG. 3E and FIG. 3F, described above.

As shown in FIG. 4A to FIG. 4E, in the comparative technique, even when a disconnection has not occurred, the phase current iΨ becomes equal to or less than the specified current Iα during the period that the phase current iΨ is near the zero-cross timing. As a result, the counter Tcnt is counted upward (refer to times t1 to t2, t3 to t4, t5 to t6, and t7 to t8). Therefore, differentiation is required to be made between the phase current iΨ becoming equal to or less than the specified current Iα when a disconnection has not occurred and the phase current iΨ becoming equal to or less than the specified current Iα when a disconnection has actually occurred. In order to meet this requirement, the prescribed value Cα is set as follows.

Specifically, the period near the zero-cross timing of the phase current iΨ becomes shorter, the rotation speed of the motor generator 10 becomes higher. Therefore, within the low-speed range of the motor generator 10, the specified value Cα is set to a relatively large value corresponding to the low-speed range in order to prevent the disconnection being erroneously detected despite the disconnection not having occurred. The amount of time that is set, from when a disconnection actually occurs until the disconnection is detected (time t9 to t10) increases within the high-speed range of the motor generator 10. In other words, the rotation speed range of the motor generator 10 in which a disconnection can be promptly detected can be limited.

According to the present embodiment described in detail above, the following effects can be achieved.

(1) The disconnection detecting process that uses the phase current iΨ and the current change rate IdotΨ is performed. Therefore, the amount of time from when a disconnection actually occurs until the disconnection is detected can be shortened. Furthermore, in the disconnection detecting process, limitation of the rotation speed range of the motor generator 10 in which a disconnection is promptly detected can be prevented.

(2) When the counter Tcnt is judged having reached the specified value Cα, a disconnection is judged having occurred. In other words, when the state in which the disconnection detecting section 36 is judging YES at step S14 in FIG. 2 continues for a predetermined amount of time, a judgment is made that a disconnection has occurred. Therefore, the accuracy of disconnection detection can be improved.

(3) When a judgment is made that a disconnection has occurred, this judgment is notified externally. As a result, suitable failsafe behavior can be actualized.

(Other Embodiments)

The above-described embodiment may be modified as follows.

According to the above-described embodiment, a disconnection detecting process that uses one or two of the U-phase current calculation value iu, the V-phase current detection value iv, and the W-phase current detection value iw may be performed.

At step S14 in FIG. 2 according to the above-described embodiment, the condition relating to the current change rate IdotΨ may be replaced by a condition that the absolute value of a change quantity of the phase current iΨ is equal to or less than a specified quantity (>0). This is based on that one can determine that the current change rate IdotΨ will becomes equal to or less than the specified value Vα since the absolute value of the change quantity of the phase current iΨ will become equal to or less than the specified quantity in view of the process, shown in FIG. 2, being repeatedly performed at a predetermined calculation cycle.

The processing operations at step S18, step S16, and step S20 in FIG. 2 according to the above-described embodiment may be omitted. In this instance as well, disconnection can be detected.

According to the above-described embodiment, a current sensor that detects the U-phase current may be included. A disconnection detecting process based on the U-phase current (U-phase current detection value) detected by the current sensor may be performed.

The control method for calculating the designated voltage based on the detection value of the phase current is not limited to the current vector control and may be, for example, instantaneous current value control.

The condition that a command to drive the motor generator 10 is given is not limited to that given as an example according to the above-described embodiment. For example, because the q-axis current iqr contributes greatly to the output torque of the motor generator 10, the condition may be that the absolute value of the q-axis designated current iq* is a predetermined value or more.

The "direct-current power supply" is not limited to the high-voltage battery 12. For example, when a system is used in which a boost converter is interposed between the high-voltage battery 12 and the inverter INV, the boost converter serves as the direct-current power supply.

A configuration may be used in which the motor generator 10 is directly connected to a three-phase alternating-current power supply.

The "rotating electrical machine" is not limited to that having a Y-connection structure and may have a a-connection structure. In this instance, a disconnection detecting process based on the line current flowing to the rotating electrical machine may be performed. In addition, the "rotating electrical machine" is not limited to the permanent magnet type synchronous motor and may be, for example, a field winding type synchronous motor. Furthermore, the "rotating electrical machine" is not limited to a synchronous motor and may be an induction motor.

The rotating electrical machine is not limited to a three-phase rotating electrical machine and may be, for example, a rotating electrical machine having four or more phases. In addition, the rotating electrical machine is not limited to that serving as a main driving engine for vehicles, and may be that which drives a compressor for air conditioning. In this instance, the controlled variable of the rotating electrical motor is not limited to torque, and may be rotation speed. In this instance, at step S12 in FIG. 2 described above, the condition relating to the designated torque Tr* can be replaced by a condition that a designated value of the rotation speed is a predetermined value or more. Furthermore, the "rotation electrical machine" is not limited to that mounted in a vehicle.

What is claimed is:

1. A disconnection detecting device for a rotating electrical machine, comprising:
    a CPU;
    an execution judgment section enabling the CPU to judge whether or not predetermined execution conditions are satisfied, the predetermined execution conditions including a condition that driving is commanded to the rotating electrical machine by a user; and
    a disconnection judgment section enabling the CPU to determine, during the execution conditions are satisfied, that a disconnection has occurred on a current flow path including the rotating electrical machine, based on i) a first condition that an absolute value of a line current flowing to the rotating electrical machine is equal to or less than a value of a specified current which is greater than zero, and ii) a second condition that an absolute value of a rate of change in the line current is equal to or less than a specified value which is higher than zero.

2. The disconnection detecting device according to claim 1, wherein
    the disconnection judgment section determines that the disconnection has occurred on the current flow path including the rotating electrical machine, based on a third condition that both the first condition and the second condition have been satisfied for at least a specified time.

3. The disconnection detecting device according to claim 2, wherein
    the rotating electrical machine is electrically connected to a direct-current power supply through an inverter; and
    the disconnection judgment section judges a disconnection of a current flow path including the rotating electrical machine, the inverter and the direct-current power supply.

4. The disconnection detecting device according to claim 3, wherein the disconnection detecting device further comprises
    a notification section being suitable for notifying externally that the disconnection has occurred in an event that the disconnection judgment section has determined that the disconnection has occurred.

5. The disconnection detecting device according to claim 1, wherein
    the rotating electrical machine is electrically connected to a direct-current power supply through an inverter; and
    the disconnection judgment section judges a disconnection of a current flow path including the rotating electrical machine, the inverter and the direct-current power supply.

6. The disconnection detecting device according to claim 1, wherein the disconnection detecting device further comprises
    a notification section being suitable for notifying externally that the disconnection has occurred in an event that the disconnection judgment section has determined that the disconnection has occurred.

7. The disconnection detecting device according to claim 2, wherein the disconnection detecting device further comprises
    a notification section being suitable for notifying externally that the disconnection has occurred in an event that the disconnection judgment section has determined that the disconnection has occurred.

8. The disconnection detecting device according to claim 5, wherein the disconnection detecting device further comprises
    a notification section being suitable for notifying externally that the disconnection has occurred in an event that the disconnection judgment section has determined that the disconnection has occurred.

9. A method for disconnection detecting of a rotating electrical machine, wherein the method comprises steps of:
    judging whether or not predetermined execution conditions are satisfied, the predetermined execution conditions including a condition that driving is commanded to the rotating electrical machine; and
    determining, in a state in which the execution conditions are satisfied, that a disconnection has occurred on a current flow path including the rotating electrical machine, based on i) a first condition that an absolute value of a line current flowing to the rotating electrical machine is equal to or less than a value of a specified current, the specified current being greater than zero, and ii) a second condition that an absolute value of a rate of change in the line current is equal to or less than a specified value, the specified value being higher than zero.

10. The method for disconnection detecting of a rotating electrical machine according to claim 9, wherein the method further includes a step of:
    determining that the disconnection has occurred on the current flow path including the rotating electrical machine, based on a third condition that both the first condition and the second condition have been satisfied for at least a specified time.

11. The method for disconnection detecting of a rotating electrical machine according to claim 10, wherein
    the rotating electrical machine is electrically connected to a direct-current power supply through an inverter; and
    the method further includes a step of:
    judging a disconnection of a current flow path including the rotating electrical machine, the inverter and the direct-current power supply.

12. The method for disconnection detecting of a rotating electrical machine according to claim 11, wherein the method further includes a step of notifying externally that the disconnection has occurred.

* * * * *